(12) United States Patent
Jaffrennou et al.

(10) Patent No.: US 9,406,820 B2
(45) Date of Patent: Aug. 2, 2016

(54) METHOD FOR FABRICATING PHOTOVOLTAIC CELLS WITH PLATED CONTACTS

(71) Applicants: IMEC VZW, Leuven (BE); Total Marketing Services, Paris la Défense (FR); Katholieke Universiteit Leuven, KU LEUVEN R&D, Leuven (BE)

(72) Inventors: Périne Jaffrennou, Ixelles (BE); Angel Uruena De Castro, Leuven (BE)

(73) Assignees: IMEC vzw, Leuven (BE); Total Marketing Services, Paris la Défense (FR); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 14/485,477

(22) Filed: Sep. 12, 2014

(65) Prior Publication Data

US 2015/0024541 A1    Jan. 22, 2015

Related U.S. Application Data

(63) Continuation of application No. PCT/EP2013/055093, filed on Mar. 13, 2013.

(60) Provisional application No. 61/610,930, filed on Mar. 14, 2012.

(51) Int. Cl.

| | |
|---|---|
| H01L 21/00 | (2006.01) |
| H01L 31/0232 | (2014.01) |
| H01L 31/0224 | (2006.01) |
| H01L 31/0236 | (2006.01) |
| H01L 31/068 | (2012.01) |
| H01L 31/18 | (2006.01) |

(52) U.S. Cl.
CPC .... *H01L 31/02327* (2013.01); *H01L 31/02363* (2013.01); *H01L 31/022425* (2013.01); *H01L 31/068* (2013.01); *H01L 31/186* (2013.01); *Y02E 10/547* (2013.01)

(58) Field of Classification Search
None
See application file for complete search history.

(56) References Cited

U.S. PATENT DOCUMENTS 4,404,735 A * 9/1983 Sakurai ............... H01L 21/268
257/368

(Continued)

FOREIGN PATENT DOCUMENTS

EP    0 567 764 A1    3/1993

OTHER PUBLICATIONS

International Search Report and Written Opinion dated Jul. 5, 2013 in PCT Application No. PCT/EP2013/055093.

(Continued)

*Primary Examiner* — Calvin Choi
(74) *Attorney, Agent, or Firm* — Knobbe, Martens, Olson & Bear LLP

(57) ABSTRACT

The disclosed technology relates generally to photovoltaic cells, and more particularly to photovoltaic cells with plated metal contacts. In one aspect, a method of fabricating a photovoltaic cell with a metal contact pattern on a surface of a semiconductor substrate includes locally smoothening portions of the surface of the semiconductor substrate by using a first laser, at predetermined locations. The method additionally includes doping the surface of the semiconductor substrate to form an emitter region. The method additionally includes forming a dielectric layer on the surface of the semiconductor substrate, and subsequently forming openings through the dielectric layer by using a second laser, thereby locally exposing the underlying surface of the semiconductor substrate at the predetermined locations. The method further includes forming metal contacts at exposed regions of the surface of the semiconductor substrate by plating.

13 Claims, 4 Drawing Sheets

(56) References Cited

U.S. PATENT DOCUMENTS

| | | | |
|---|---|---|---|
| 6,429,037 B1* | 8/2002 | Wenham et al. | 438/57 |
| 2009/0325336 A1* | 12/2009 | Abbott et al. | 438/57 |
| 2011/0197965 A1* | 8/2011 | Finarov et al. | 136/256 |

OTHER PUBLICATIONS

MC Morilla, R. Russell, JM Fernandez, "Laser induced ablation and doping processes on high efficiency silicon solar cells," Proc. 23rd European Photovoltaic Solar Energy Conference and Exhibition, held in Valencia, Spain, pp. 1506-1509 (2008).

* cited by examiner

METHOD FOR FABRICATING PHOTOVOLTAIC CELLS WITH PLATED CONTACTS

CROSS-REFERENCE TO RELATED APPLICATIONS

This application is a continuation of PCT Application No. PCT/EP2013/055093, filed Mar. 13, 2013, which claims the benefit of U.S. Provisional Application No. 61/610,930, filed Mar. 14, 2012. Each of the above applications is hereby incorporated by reference in its entirety.

BACKGROUND OF THE INVENTION

1. Field of the Invention

The disclosed technology relates generally to photovoltaic cells, and more particularly to photovoltaic cells with plated metal contacts.

2. Description of the Related Technology

New concepts and fabrication processes are being developed for various aspects of silicon photovoltaic devices, aimed at higher efficiency devices that can also be manufactured at similar or lower cost compared to existing devices. One such area of development is in the metallization technology of photovoltaic cells. For example, plating processes have been proposed for forming metal contacts for photovoltaic devices, as an alternative to screen printing processes used in many devices.

Some plating processes, e.g., those used in forming front side metallization of silicon photovoltaic cells, include providing a dielectric layer, e.g., an antireflection coating over a front surface, and subsequently locally removing the antireflection coating, thereby exposing the underlying silicon surface at locations where metal contacts are to be formed in subsequent processes. In subsequent processes, for example, a metal plating process can be employed to form front side metal contacts in the exposed silicon regions. The antireflection coating can be locally removed, for example, via a laser ablation process.

In some technologies, the silicon front surface is textured to improve photovoltaic conversion efficiency. While advantageous for improving the conversion efficiency, the textured surfaces can introduce some process challenges. For example, a material, e.g., an antireflection coating, formed on a textured silicon surface can have nonuniformities that can pose difficulties in completely removing the material in subsequent processes due to, for example, shadowing effects and/or anisotropic nature of the subsequent removal process. As a result, it can be a challenge to completely remove the antireflection coating locally, without damaging the underlying emitter region. Incomplete removal of the antireflection coating can in turn pose additional problems, such as poor electrical contact of the metallization, poor adhesion and/or a high contact resistance. On the other hand, aggressive removal processes, which can damage the underlying emitter region can also have negative consequences, such as shunts and/or increased minority carrier recombination losses, which can lead to an overall degradation of cell performance. Thus, there is a need for photovoltaic devices and methods of fabricating the same, where the silicon front surface is textured for improved photovoltaic conversion efficiency, while having metal contacts that are formed on the front surface using a plating process without suffering from degraded electrical contact and or cell performance.

In photovoltaic cells with a selective emitter structure, i.e. an emitter structure with heavily doped regions underneath the metal contacts and lightly doped regions in between the metal contacts, an additional challenge is the alignment of the laser ablation pattern (for local removal of the antireflection coating) with the heavily doped regions of the underlying selective emitter structure.

SUMMARY OF CERTAIN INVENTIVE ASPECTS

Certain inventive aspects relate to a method of fabricating photovoltaic cells with a textured surface and with plated metal contacts, wherein the metal contacts are provided by plating of at least one metal in openings formed in a dielectric layer deposited on the textured surface, the openings being formed by locally removing the dielectric layer by means of laser ablation, and wherein the method allows a good and complete local removal of the dielectric layer with a reduced risk of damaging an underlying doped region, such as an emitter region, as compared to prior art methods. In one inventive aspect with a selective emitter structure, a method offers easy alignment of the metal contacts to the heavily doped regions of the underlying emitter structure.

Certain inventive aspects relate to silicon photovoltaic cells with a textured surface and plated contacts, with a low contact resistance (e.g. lower than 0.1 Ohm·cm$^2$) and a good fill factor (e.g. higher than 78%).

One inventive aspect relates to a method of fabricating photovoltaic cells with a plated metal contact pattern on a rough, e.g. textured, surface of a semiconductor substrate, wherein the method comprises: locally smoothening the surface of the semiconductor substrate by means of a first laser at predetermined locations in accordance with the metal contact pattern; forming an emitter region at the substrate surface; providing a dielectric layer on the substrate surface; forming openings through the dielectric layer by means of a second laser, thereby locally exposing the underlying substrate surface at locations corresponding to the metal contact pattern; and providing metal contacts at the exposed regions of the substrate surface by means of plating.

The semiconductor substrate can for example be a crystalline silicon substrate, e.g. a mono crystalline, a multi crystalline or a poly crystalline silicon substrate. However, the present disclosure is not limited thereto and other suitable semiconductor substrates can be used.

In one inventive aspect, the rough surface can be a front surface of the cell. It can also be a back surface of the cell, e.g. in the case of bifacial cells having a textured front side and a textured back side, as well as patterned metal contacts both at the front side and at the back side.

A rough surface can for instance be a surface having an average reflectivity lower than 15% for visible light (wavelength range between 380 nm and 740 nm). A smoothened surface derived from an originally rough surface can be a surface having an average reflectivity for visible light (wavelength range between 380 nm and 740 nm) which is higher than the average reflectivity of the originally rough surface. A smooth surface can be a surface which has an average reflectivity higher than 20%, higher than 25%, or higher than 30%, compared to the average reflectivity of the originally rough surface, for light within the same wavelength range.

Locally smoothening the surface can for example be done by means of a pulsed UV laser, with a suitable laser fluence for locally melting the silicon and with a pulse duration, e.g., in the range between about 1 ns and 1000 ns, between about 5 ns and 100 ns, or between about 5 ns and 20 ns. However, the present disclosure is not limited thereto and other pulse durations can be used, e.g., picosecond (ps) pulses can be used. It is an advantage of using a laser with an UV wavelength that the UV light is absorbed in a thin layer (e.g. a few micrometers, for instance having a thickness below 3 micrometer, or below 2 micrometer or below 1 micrometer) of silicon near the surface, thus avoiding deeper damage to the silicon.

A smoothened surface can thus correspond to an at least partially melted surface of an originally textured front surface of a cell. A smoothed surface can be a surface which is produced from, or achieved by processing of, an original surface (for instance a textured surface) and which has a roughness which is smaller than the roughness of the original surface. A smoothed surface can also correspond to a surface which is produced from, or is achieved by processing of, an original surface (for instance a textured surface) and which has a higher average reflectivity than the original surface, for instance for a predetermined wavelength or wavelength range. Such predetermined wavelength range can for example be a range of visible wavelengths, e.g. between 380 nm and 740 nm. It is an advantage of embodiments of the present invention wherein an at least partially melted surface of an originally textured front surface of a cell is used as smoothened surface, that the quality (adhesion, contact resistance) of the metal plating process (thus of the plated metal contacts) is improved.

Forming an emitter region can comprise forming a homogeneous emitter, i.e. an emitter having a same doping profile over the entire substrate surface. Alternatively, forming an emitter region can comprise forming a selective emitter, i.e. an emitter comprising heavily doped regions at locations corresponding to the metal contact pattern, and comprising more lightly doped regions in between these predetermined locations. An emitter region can be formed by methods known to a person skilled in the art, such as for example by diffusion from a liquid or a solid source or by ion implantation.

Providing a dielectric layer can comprise providing a single dielectric layer or providing a dielectric layer stack comprising at least two dielectric layers. In some embodiments the dielectric layer has the function of an antireflection coating and provides surface passivation. The dielectric layer can for example be a silicon nitride layer or a titanium nitride layer. The dielectric layer can for example be a layer stack comprising a silicon oxide layer and/or a silicon nitride layer and/or an aluminum oxide layer and/or a titanium oxide layer, such as for example a silicon oxide/silicon nitride stack or for example an aluminum oxide/silicon nitride stack. However, any other suitable layer or layer stack known to a person skilled in the art can be used for providing surface passivation and for forming an antireflection coating.

Providing metal contacts can comprise providing a metal layer stack. For example, first a seed layer such as a layer comprising Ni, Ti or Ag can be provided, for example by sputtering, screen printing, electroless plating or light induced plating. On top of the seed layer, a contact layer such as a Cu layer or a Ag layer can be provided by plating. Optionally a capping layer e.g. comprising Sn, Ag or Cu can be plated on top of the contact layer.

It is an advantage of a method according to one inventive aspect that the step of forming openings through the dielectric layer is done in areas with a smoothed surface, thus allowing a good and complete removal of the dielectric layer without damaging the underlying emitter region. It is an advantage that the metal contacts are provided in such area with a smoothed surface, thus allowing the formation of contacts with low contact resistance and good adhesion properties.

It is an advantage of a method according to one inventive aspect that the step of locally smoothening the surface results in the formation of areas with a smoothed surface having an average reflectivity that is substantially higher than the average reflectivity of the rough (non-smoothed) areas, in a visible wavelength range. This allows good alignment of the pattern of openings through the dielectric layer (at locations corresponding to the metal contact pattern) to the areas with smoothed surface, based on reflectivity measurements. In embodiments with a selective emitter structure it also allows good alignment between the metal contacts and the heavily doped regions of the selective emitter structure.

Certain objects and advantages of some inventive aspects have been described herein above. Of course, it is to be understood that not necessarily all such objects or advantages may be achieved in accordance with any particular embodiment of the disclosure. Thus, it will be appreciated that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure as claimed. The disclosure, both as to organization and method of operation, together with features and advantages thereof, may best be understood by reference to the following detailed description when read in conjunction with the accompanying drawings.

DETAILED DESCRIPTION OF CERTAIN ILLUSTRATIVE EMBODIMENTS

Figure 1:
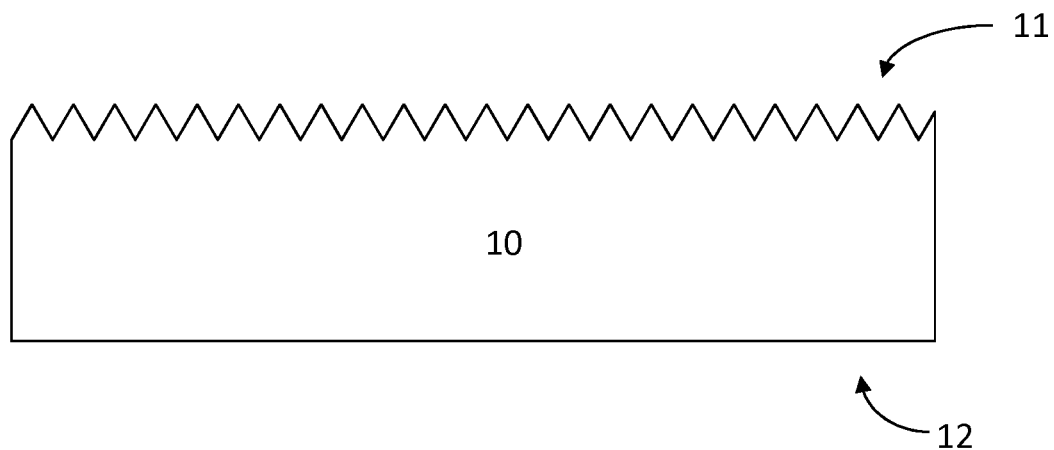
FIG. 1 to FIG. 6 illustrate intermediate structures of a photovoltaic device at various stages of fabrication, according to some embodiments.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, a front surface, also referred to as a front side of a photovoltaic cell refers to the surface or the side configured to be oriented towards a light source and receive illumination. In embodiments where a photovoltaic cell is a bifacial photovoltaic cell, both front and back surfaces can be configured to receive the illuminated light. In these embodiments, the front surface refers to the surface that is configured to receive a larger fraction of the illuminated light compared to the surface that is configured to receive a smaller fraction of the illuminated light, which would correspond to the back surface. The back surface, also referred to as the back side, rear surface or rear side of a photovoltaic cell, refers to the surface opposite to the front surface. Also as used herein, the front side of a substrate is the side of the substrate corresponding to the front side of the photovoltaic cell, while the rear side or back side of the substrate corresponds to the back side of the photovoltaic cell.

According to some embodiments disclosed herein, a method of fabricating photovoltaic cells with a plated metal contact pattern on a rough, e.g. textured, surface of a semiconductor substrate according to one embodiment comprises: locally smoothening the surface of the semiconductor substrate by means of a laser at predetermined locations in accordance with the metal contact pattern; forming an emitter region at the substrate surface; providing a dielectric layer on the substrate surface; forming openings through the dielectric layer by means of a laser, thereby locally exposing the underlying substrate surface at locations corresponding to the metal contact pattern; and providing metal contacts at the exposed regions of the substrate surface by means of plating.

According to some other embodiments, the semiconductor is crystalline silicon, i.e. for the fabrication of crystalline silicon photovoltaic cells. However, the method is not limited thereto. It can be used for any photovoltaic cell having a rough, e.g. textured, surface and a plated metal contact pattern.

According to some other embodiments, the textured surface is a front surface of a photovoltaic cell and wherein the plated metal contacts are front side contacts of the cell. However, the present disclosure is not limited thereto. A method can for example also be used to form plated contacts at the rear side of a cell, for example for bifacial cells having a textured front and back surface and having patterned metal contacts both at the front and the back side of the cell.

According to some other embodiments, the emitter region can be a homogeneous emitter region or a selective emitter region.

According to some other embodiments, the dielectric layer can be a single layer or a stack comprising at least two layers. In the photovoltaic device the dielectric layer can serve the function of a surface passivation layer and/or an antireflection coating.

In the following, intermediate structures of a photovoltaic device at various stages of fabrication are described, according to embodiments, in reference to FIGS. 1 to 6. An intermediate structure of another photovoltaic device according to alternative embodiments is described in reference to FIG. 7.

FIG. 1 illustrates an intermediate structure of a photovoltaic device, according to some embodiments. The intermediate structure of FIG. 1 includes a substrate 10 having a front surface 11 and a rear surface 12. In some embodiments, the substrate 10 comprises a crystalline silicon substrate, e.g., a single crystalline or a polycrystalline silicon wafer. In the illustrated embodiment, the front surface 11 is textured and has a relatively rough surface structure, while the rear surface 12 is polished and has a relatively smooth surface structure. Texturing and polishing can be performed using a suitable method. For example, the front surface 11 can be textured by etching, e.g., wet or dry etching, resulting in a surface having protrusions and/or recesses. In some embodiments, the protrusions can be in the form of pyramids, e.g., random pyramids or regular pyramids, and the recesses can be in the form of random or regular inverted pyramids, or pits. Other suitable texturing processes can be used to obtain other forms of textured surfaces.

Figure 2:
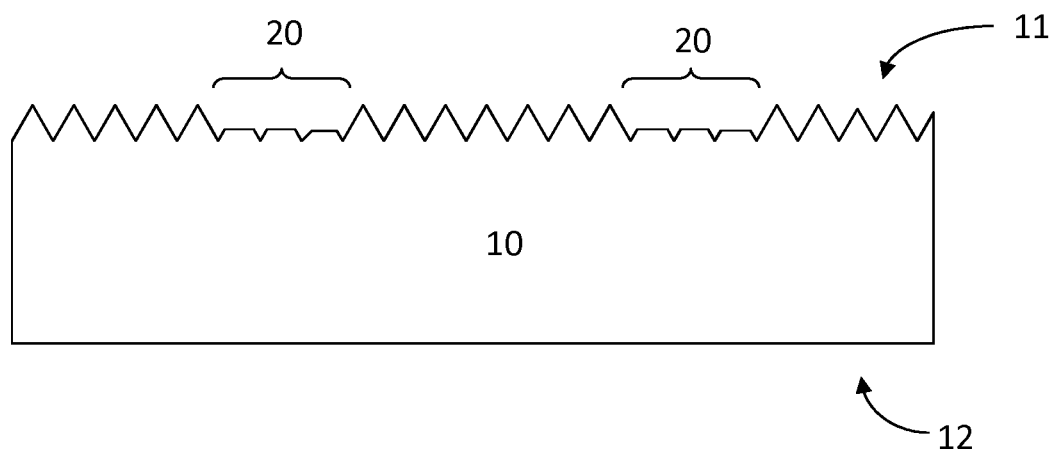

FIG. 2 illustrates another intermediate structure of a photovoltaic device, according to some embodiments. In the illustrated embodiment of FIG. 2, the front surface 11 is locally melted using a laser. The front surface 11 can be melted by employing, for example, Laser Assisted Melting Process (LAMP). Locally melting and recrystallizing the substrate material produces smoothened surfaces, at predetermined locations 20. The predetermined locations 20 (also referred to herein as predetermined areas, locations, or areas) correspond to regions where a metal contact pattern to be formed at a later stage of the fabrication process. In some embodiments, the laser can be pulsed. The temporal width of the pulse, or the duration of the pulse, can be between about 1 ns and 1000 ns, between about 5 ns and 100 ns, or between about 5 ns and 20 ns, based on a full-width at half-maximum (FWHM) of the pulse. However, the present disclosure is not limited thereto and other pulse durations can be used, e.g., ps pulses can be used. According to some embodiments, the wavelength of the laser is in the UV range and can be, for instance be within the range of 200 nm to 400 nm, 260 nm to 380 nm, for instance about 355 nm. The inventors have found that choosing a particular combination of pulse width and wavelength of the laser enhances light absorption in a thin layer (about a few micrometers) of silicon near the surface and prevents damages to the silicon below the thin layer. In some embodiments, the laser fluence is selected or adapted for inducing silicon melting, while avoiding silicon ablation (e.g., sublimation). A suitable laser fluence depends on the laser wavelength and on the pulse duration used, and can e.g. be determined experimentally. In other words, the parameters for a suitable laser fluence can be predetermined for a specific production process or application. For example, inventors have obtained local melting not exceeding a few micrometers of silicon in depth near the surface using a laser fluence between 10 mJ/cm$^2$ and about 100 mJ/cm$^2$, for instance about 50 mJ/cm$^2$, for a 355 nm wavelength laser with pulse duration between about 5 ns and about 10 ns, for instance 6 ns. This step results in local melting of the silicon near the front surface, leading to local smoothening of the surface texture.

In the areas 20 treated with the laser, the surface roughness is strongly reduced as compared to the areas not treated with the laser. The difference in surface roughness also results in a difference in reflectivity. It was experimentally found that in the predetermined areas 20 treated with the laser the average reflectivity in the wavelength range between 360 nm and 740 nm can be in the order of about 30%, while in the non-treated (textured) areas the average reflectivity in the same wavelength range is in the order of about 12%. After performing the laser annealing step, the surface material that is damaged by the laser can be removed by etching, e.g. in a HF:$HNO_3$ solution, or it can be removed by annealing, such that the resulting smoothened surface in the predetermined areas 20 is substantially free of laser-induced damage. Compared to an initial roughness of the surface, the roughness of the predetermined areas 20, measured in root-mean squared (RMS) roughness, can be between about 1% and about 80% of the initial value, between about 1% and about 50% of the initial value, or between about 1% to 20% of the initial value, depending on the various laser parameters chosen within the ranges specified above.

Figure 3:
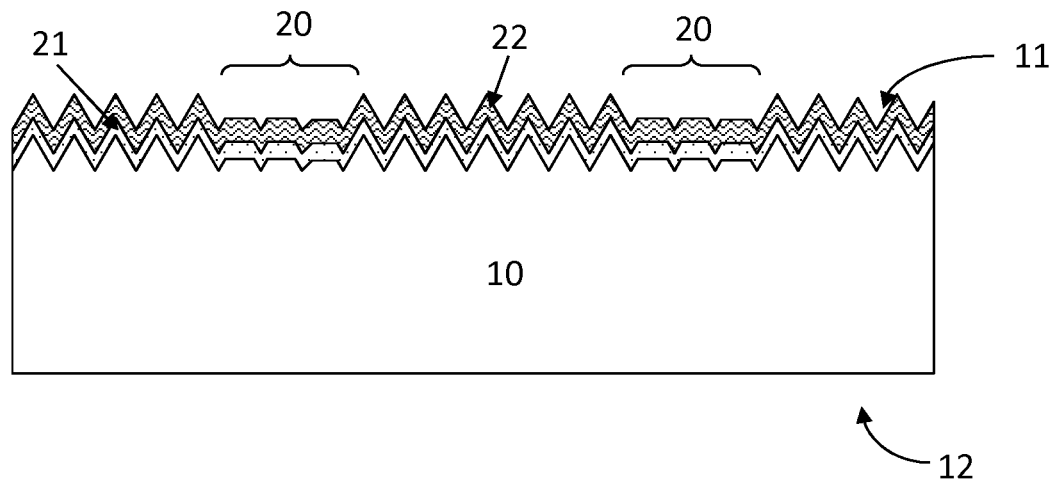

FIG. 3 illustrates another intermediate structure of a photovoltaic device, according to some embodiments. After smoothening the surface in the predetermined areas 20, an emitter region 21 is formed at the front side of the substrate, followed by formation of one or more dielectric layers 22, which can include a passivation layer and/or an antireflection coating on the front surface. In some embodiments, the emitter region 21 is formed via a diffusion process using a liquid or a solid source. In some other embodiments, the emitter region 21 is formed by ion implantation. Where included, the antireflection coating can include, for example, silicon nitride. The illustrated embodiment in FIG. 3 represents the intermediate structure after formation of the one or more dielectric layers 22. While in FIG. 3 the one or more dielectric layers 22, which can include the passivation layer and/or the antireflection coating, is depicted as a single dielectric layer, it will be appreciated that the passivation layer and/or the antireflection coating can be separate and distinct layers and/or can comprise a stack of layers. For example, a silicon oxide layer or an aluminum oxide layer can be provided as a surface passivation layer, and the surface passivation layer can be covered by a silicon nitride layer which serves as an antireflection layer.

Figure 4:
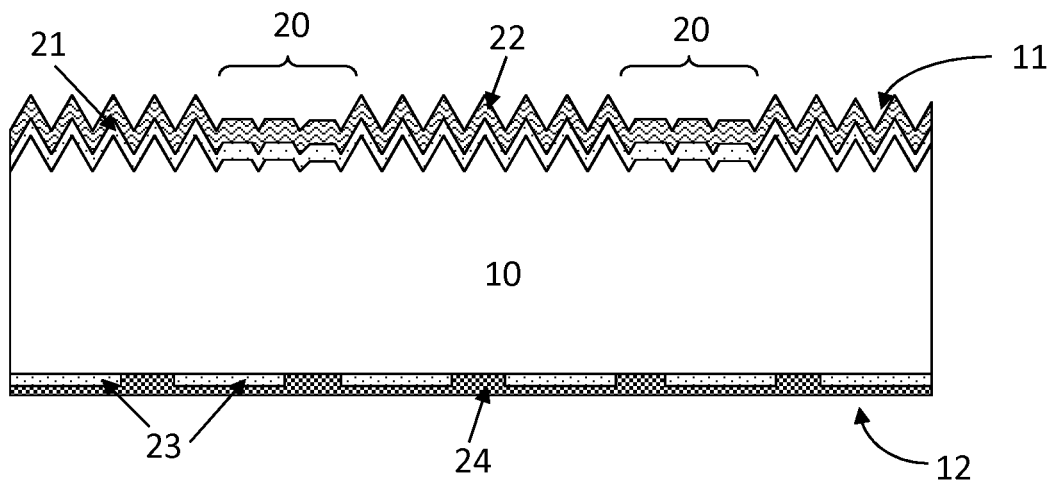

FIG. 4 illustrates another intermediate structure of a photovoltaic device, according to some embodiments. After deposition of the one or more dielectric layers 22 on the front surface 11, a passivation layer 23 or a passivation stack and metal contacts 24 can be provided at the rear surface 12. This is schematically illustrated in FIG. 4 for an embodiment with local back contacts. However, the present disclosure is not limited thereto and other configurations known to a person skilled in the art can be used at the rear side of the cell. Providing the passivation layer and the metal contacts at the rear side of the cell can also be performed at another stage of the process flow, such as after laser ablation of the dielectric layer at the front side or for example after front side metallization.

Figure 5:
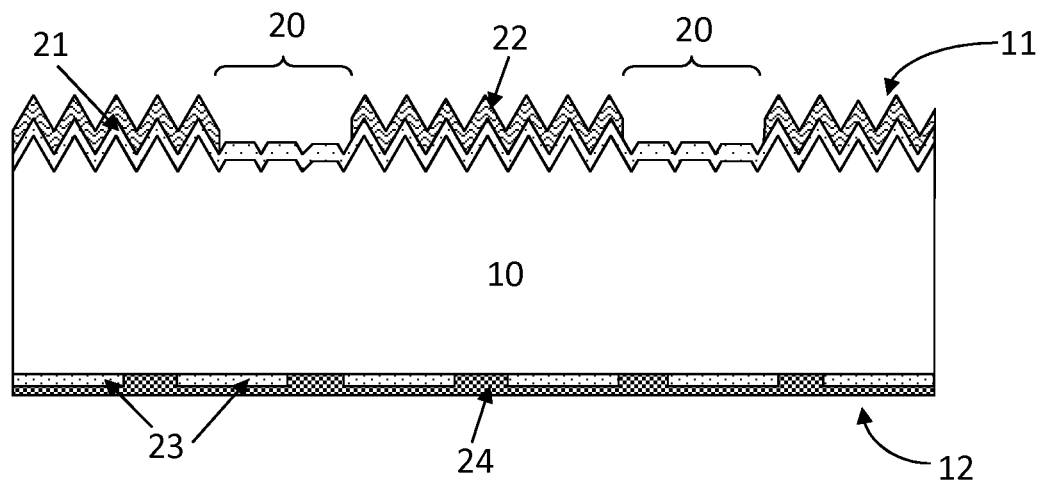

FIG. 5 illustrates another intermediate structure of a photovoltaic device, according to some embodiments. In the illustrated embodiment of FIG. 5, the one or more dielectric layers 22, including for instance a SiN layer, is locally removed by laser ablation, e.g., using an UV laser. In some embodiments, the UV laser is a different laser than the one used for locally melting the substrate as described above with respect to FIG. 2. The UV laser used can have, for example, a pulse width that is substantially shorter, for example less than 1 ns. In some embodiments, the pulse width of the UV laser can be, for example, between about 0.1 ps to about 900 ps, between about 0.1 ps to about 100 ps, or between about 0.1 ps and about 10 ps. Upon laser-ablating the dielectric layer 11 using the laser pulses, openings are formed through the one or more dielectric layers 22, thereby exposing the underlying substrate surface at the predetermined areas 20 that correspond to locations where the front side metal contacts are to be formed in subsequent processes.

In the illustrated embodiment of FIG. 5, the openings through the one or more dielectric layers 22 are in substantial alignment with the predetermined areas 20 in which the surfaces of the substrate have been locally smoothened. It is an advantage to have good alignment between the openings in the dielectric layer 22 and the smoothened surface of the substrate in the predetermined areas 20, because of the higher reflectivity of these areas as compared to the textured areas between the predetermined areas 20. In some embodiments, the level of offset in alignment, measured as a percentage of a lateral width of the predetermined areas 20 in a direction generally parallel to the planes of the first and second surfaces 11 and 12, can be between about 1% and about 50%, between about 1% and about 20%, or about 1% and about 10%. In some embodiments, to maximize the alignment, a camera system can be used to detect the pattern and perform the alignment, based on reflectivity differences. It will be appreciated that because the underlying emitter region 21 has a smoothened surface as described above with respect to FIG. 3, the removal of the one or more dielectric layers 22 if effective without damaging the underlying emitter region 21 is possible. This is because the smoothness of the front surface 11 in the predetermined areas 20 enables a relatively uniform thickness of the one or more dielectric materials 20 measured in a direction orthogonal to the general planes of the front and back surfaces 11 and 12.

Figure 6:
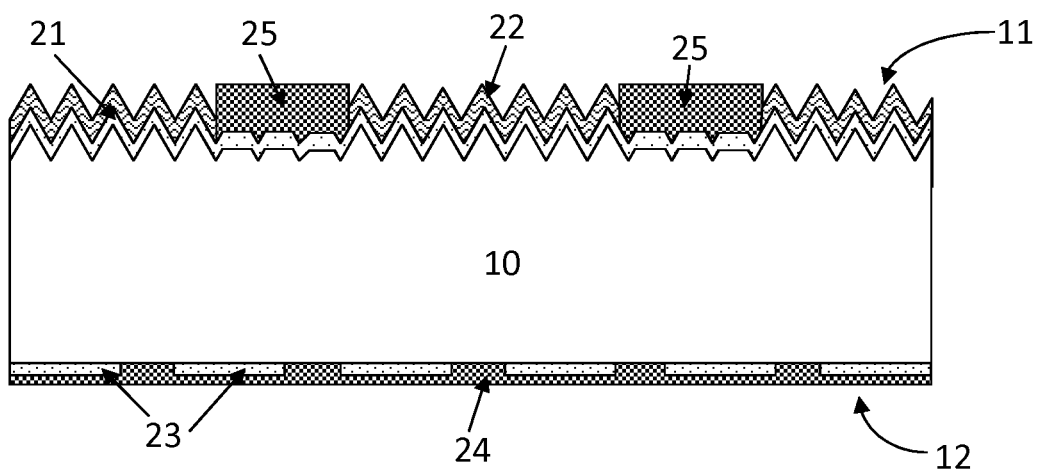

FIG. 6 illustrates another intermediate structure of a photovoltaic device, according to some embodiments. After local removal of the dielectric layer 22, front side metal contacts 25 are provided using a metal plating process (FIG. 6). In some embodiments, first a seed layer such as a layer comprising Ni, Ti or Ag is provided, for example by sputtering, screen printing, electroless plating or light induced plating. After seed layer deposition, e.g. Ni seed layer deposition, a silicidation step may be performed. On top of the seed layer a contact layer such as a Cu layer or a Ag layer is plated, and optionally a capping layer e.g. comprising Sn, Ag or Cu can be plated on top of the contact layer. It is an advantage of a method according to one embodiment that the metal contacts are provided in areas 20 with smoothed surface texture (i.e. less rough), such that good contacts with low contact resistance and with a good adhesion can be obtained.

It is an advantage of providing the front side contacts by plating that the width of the contact pattern (e.g. finger width, bus bar width) can be smaller as compared to a screen printed contact pattern, thus leading to reduced shadowing losses.

Figure 7:
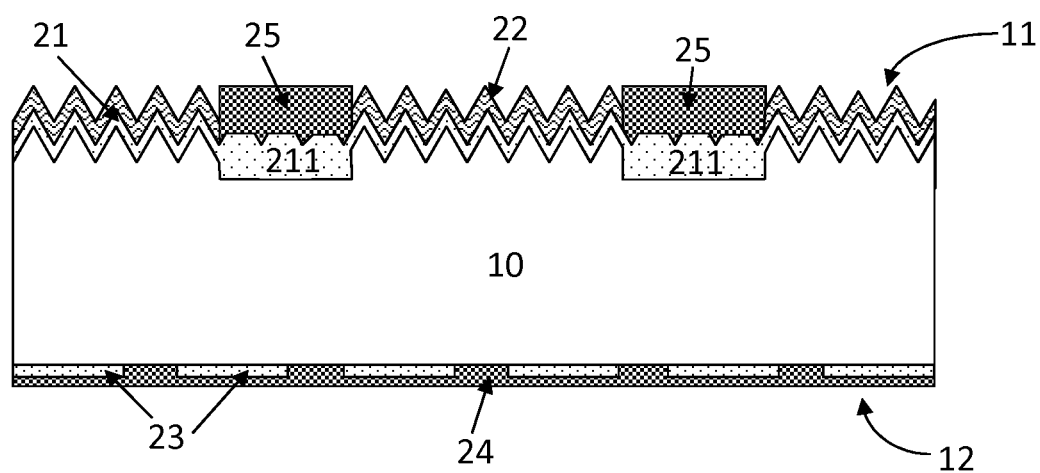
FIG. 7 illustrates an intermediate structure of a photovoltaic device at a stage of fabrication, according to some other embodiments In the different drawings, the same reference signs refer to the same or analogous elements.

FIG. 7 illustrates an intermediate structure of a photovoltaic device, according to some alternative embodiments, illustrating a method of fabricating photovoltaic cells having a selective emitter structure. In such embodiments, processes leading up to forming an emitter region 21 is similar to those described above with respect to FIGS. 1-3. After forming the emitter region 21 at the front side of the substrate in a manner similar to processes described above with respect to FIG. 3, a selective emitter having heavily doped regions 211 at locations corresponding to the metal contact pattern can be formed, for example, via laser doping or another suitable alternative process. For example, when the emitter region 21 is formed by a diffusion process, the doped glass layer thereby formed can be locally irradiated with a laser, e.g. a quasi-continuous UV laser, in the smoothed areas 20, thereby creating more heavily doped emitter regions 211 in these areas 20. This is followed by removal of the doped glass layer.

Alternatively, the doped glass layer can be removed first and a layer comprising a dopant can be provided on the front surface. Local irradiation with a laser in the smoothed areas 20 then creates heavily doped emitter regions in these areas 20. It is an advantage that good alignment of the heavily doped regions with the contact regions is possible, because of the differences in reflectivity.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made.

What is claimed is:

1. A method of fabricating a photovoltaic cell with a metal contact pattern on a surface of a semiconductor substrate, the method comprising:
   locally smoothening portions of the surface of a bulk semiconductor material of the semiconductor substrate at predetermined locations by using a first laser to form locally smoothened surfaces;
   after locally smoothening, doping the surface of the semiconductor substrate the underlying surface of the semiconductor substrate to form an emitter region;
   after doping the surface, forming a dielectric layer on the surface of the semiconductor substrate;
   forming openings through the dielectric layer by using a second laser, thereby locally exposing the locally smoothened surfaces at the predetermined locations; and
   forming the metal contact pattern contacting the locally smoothened surfaces by plating.

2. The method of claim 1, further comprising providing a surface texture on the surface of the semiconductor substrate before locally smoothening.

3. The method of claim 1, wherein the semiconductor substrate is a crystalline silicon substrate.

4. The method of claim 1, wherein locally smoothening comprises at least partially melting the portions of the surface of the semiconductor substrate.

5. The method of claim 4, wherein the first laser is an UV laser configured to generate a laser pulse having a fluence sufficient to locally at least partially melt the semiconductor substrate and a pulse duration in the range between about 1 ns and about 1000 ns.

6. The method of claim 1, wherein smoothening comprises increasing an average reflectivity of the surface of the semiconductor substrate in a visible wavelength range by at least about 20% higher compared to an average reflectivity of the surface prior to smoothening.

7. The method of claim 1, wherein forming the emitter region comprises forming a homogeneous emitter that is uniformly doped across an entire major surface of the semiconductor substrate.

8. The method of claim 1, wherein forming the emitter region comprises selectively doping the locally smoothened surfaces with higher dopant concentrations compared to surface regions between adjacent locally smoothened surfaces.

9. The method of claim 1, wherein providing a dielectric layer comprises providing a dielectric layer stack comprising at least two dielectric layers, and wherein the dielectric layer is adapted for use as an antireflection coating and surface passivation.

10. The method of claim 1, wherein providing metal contacts comprises providing a metal layer stack.

11. The method of claim 5, wherein the second laser is configured to generate a pulse that is sufficient to ablate the dielectric layer.

12. The method of claim 11, wherein the second laser is configured to generate a pulse having a duration less than 1 ns.

13. The method of claim 2, wherein doping the surface of the semiconductor surface includes doping the locally smoothened surfaces and textured surfaces between adjacent locally smoothened surfaces.

* * * * *